(12) United States Patent
Attenberger et al.

(10) Patent No.: US 7,294,564 B2
(45) Date of Patent: Nov. 13, 2007

(54) METHOD FOR FORMING A LAYERED SEMICONDUCTOR TECHNOLOGY STRUCTURE AND CORRESPONDING LAYERED SEMICONDUCTOR TECHNOLOGY STRUCTURE

(75) Inventors: Wilfried Attenberger, Landshut (DE); Jörg Lindner, Bobingen (DE); Bernd Stritzker, Augsburg (DE)

(73) Assignee: Siltronic AG, Munich (DE)

( * ) Notice: Subject to any disclaimer, the term of this patent is extended or adjusted under 35 U.S.C. 154(b) by 334 days.

(21) Appl. No.: 10/492,329

(22) PCT Filed: Oct. 11, 2002

(86) PCT No.: PCT/EP02/11423

§ 371 (c)(1),
(2), (4) Date: Apr. 9, 2004

(87) PCT Pub. No.: WO03/034484

PCT Pub. Date: Apr. 24, 2003

(65) Prior Publication Data

US 2004/0248390 A1 Dec. 9, 2004

Related U.S. Application Data

(60) Provisional application No. 60/328,759, filed on Oct. 12, 2001.

(51) Int. Cl.
*H01L 21/425* (2006.01)
(52) U.S. Cl. ............... 438/526; 438/459; 257/E21.644

(58) Field of Classification Search ............. 438/12, 438/22, 370, 480, 689, 459, 473, 514, 526; 257/13, 77, 918
See application file for complete search history.

(56) References Cited

U.S. PATENT DOCUMENTS 6,214,107 B1 * 4/2001 Kitabatake ............... 117/95
6,307,232 B1 * 10/2001 Akiyama et al. ......... 257/347

FOREIGN PATENT DOCUMENTS

WO   WO 01/72104 A1   10/2001

OTHER PUBLICATIONS

K. Volz, et al., "Ion beam induced amorphization and recrystallization of Si/SiC/Si layer systems", Nuclear Instruments and Methods in Physics Research, vol. 120, 133-138, (1996).

(Continued)

*Primary Examiner*—Quoc Hoang
(74) *Attorney, Agent, or Firm*—Brooks Kushman P.C.

(57) ABSTRACT

The following invention provides a method for forming a layered semiconductor structure having a layer of a first semiconductor material on a substrate of at least one second semiconductor material, comprising the steps of: providing said substrate; burying said layer of said first semiconductor material in said substrate, said buried layer having an upper surface and a lower surface and dividing said substrate into an upper part and a lower part; creating a buried damage layer; which at least partly adjoins and/or partly includes said upper surface of said buried layer; and removing said upper part of said substrate and said buried damage layer for exposing said buried layer. The invention also provides a corresponding layered semiconductor structure.

14 Claims, 5 Drawing Sheets

OTHER PUBLICATIONS

Figure 1A:
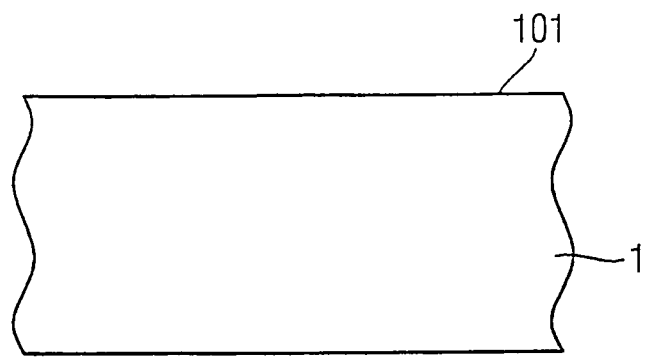

J.K.N. Linder et al., "Controlling the density distribution of SiC nanocrystals for the ion beam synthesis of buried SiC layers in silicon", Nuclear Instruments and Methods in Physics Research, vol. 147, pp. 249-255, (1999).

J.K.N. Linder et al., "KeV—and MeV-Ion Beam Synthesis of Buried SiC Layers in Silicon", Materials Research Society Symp. Proc., vol. 354, pp. 171-176 (1995).

Derwent Abstract corresponding To WO 01/72104 [2001-639195 [73]].

* cited by examiner

METHOD FOR FORMING A LAYERED SEMICONDUCTOR TECHNOLOGY STRUCTURE AND CORRESPONDING LAYERED SEMICONDUCTOR TECHNOLOGY STRUCTURE

CROSS REFERENCE TO RELATED APPLICATIONS

Applicants claim priority under 35 U.S.C. §119(e) of U.S. Ser. No. 60/328,759 filed Oct. 12, 2001. Applicants also claim priority under 35 U.S.C. §365 of PCT/EP02/11423 filed Oct. 11, 2002. The international application under PCT article 21(2) was published in English.

The present invention relates to a method for forming a layered semiconductor technology structure having a layer of a first semiconductor technology material on a substrate of at least one second semiconductor technology material and to a corresponding layered semiconductor technology structure.

Moreover, the present invention relates to layered semiconductor technology structure according to the preamble of claim 15 which is known from Volz K. et al.: "Ion beam induced amorphisation and recrystallisation of Si/SiC/Si layer systems" Nuclear Instruments & Methods in Physics Research, Section B. Beam Interactions With Materials And Atoms, North-holland Publishing Company. Amsterdam, N1 (01-12-1996), 120 (1-4), pages 133-138 and from Lindner J K N et al.: "Controlling the density distribution of SiC nanocrystals for the ion beam synthesis of buried SiC layers in silicon" Nuclear Instruments & Methods In Physics Research, Section-B: Beam Interactions With Materials And Atoms, North-holland Publishing Company. Amsterdam, N1 (1999), 147 (1-4), pages 249-255.

WO 01/72104 A1 discloses method for the production of silicon carbide layers by means of ionic implantation of carbon and neals.

It should be mentioned that the term substrate as used herein is to be understood in a general form and should include all substrates known in semiconductor technology process technology, such as wafer substrates, layer substrates, well substrates, epitaxial substrates, SIMOX substrates, SOI substrates, silicon on sapphire substrates etc.

Moreover, semiconductor technology material is to be understood as any conducting, semiconducting or isolating material used in semiconductor technology processes.

Although applicable to other semiconductor technology materials, the present invention and ist underlying problems will be discussed with regard to a silicon carbide layer on a silicon substrate.

Silicon carbide (SiC) is a semiconductor technology material which, due to its excellent physical properties combined with its technological compatibility to established semiconductor technology processes and materials, has gained increasing industrial importance in the last ten years.

A broad use of this semiconductor technology material, however, is so far obstructed by problems of availability of crystal wafers or thin films having appropriate smooth surfaces as well as by the high price resulting from the difficult manufacture of such crystal wafers and thin films, respectively. Nevertheless, some commercial semiconductor technology products are already on the market, however, which have enormously high prices. A broader scope of application of silicon carbide is to be expected if the material problems regarding cost-efficient manufacture of epitaxial silicon carbide thin films having large surfaces on inexpensive substrates are solved.

For the manufacture of silicon carbide, two standard processes are known. The first process is a single crystal growth process, and the second process is a thin film epitaxy process. Technically, useful silicon carbide is only available from single crystal growth and from homoepitaxy of silicon carbide layers on expensive silicon carbide single crystals. However, no suitable method of realizing heteroepitaxial silicon carbide films on large area inexpensive substrates is known up to today.

Figure 6A:
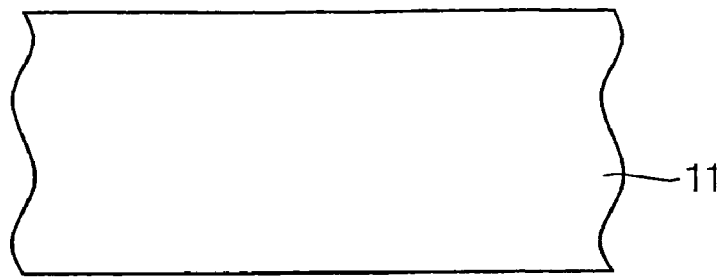
Figure 6B:
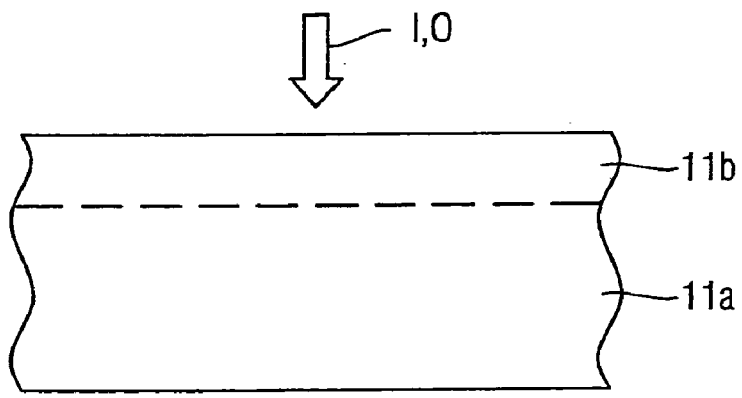
Figure 6C:

FIGS. 6a-c show a prior art process sequence for manufacturing a silicon carbide device known from U.S. Pat. No. 6,214,107 B1.

As shown in FIG. 6a, the starting point of this process is an expensive silicon carbide wafer 11.

In a first treatment step, as illustrated in FIG. 6b, an implantation I is performed for implanting ions in at least a part of a surface of said silicon carbide wafer 11 in order to introduce crystal defects in a layer 11b near the crystal surface, leaving a substrate region 11a undamaged.

In a second treatment step, an oxidation O is performed to form a silicon dioxide thin film in the implanted layer 11b on the crystal surface.

Finally, in a third step, as illustrated in FIG. 6c, the silicon dioxide thin film in the layer 11b is removed by an etching process using HF chemistry, resulting in a silicon carbide device of substrate region 11a having a cleaned surface of SiC.

A disadvantage of this known method is the fact that expensive silicon carbide wafer substrates are needed. Moreover, the necessity of an oxidation step after the implantation treatment makes the known method complicated.

Therefore, it is an object of the present invention to provide a less expensive and less complicated method for forming a layered semiconductor technology structure and an improved corresponding layered semiconductor technology structure having a smooth surface.

The method and structure according to the present invention contribute to a cost-efficient manufacture of epitaxial silicon carbide thin films having large smooth surfaces on unexpensive substrates. Moreover, the structure according to the present invention offers the advantage that the substrate manufacturer provides a semiprocessed structure which is finished at the user. Here the upper layer serves as protection for the buried layer to be exposed later in a simple etching process.

The idea underlying the present invention is to provide a buried layer and thereafter to create a buried damage layer which at least partly adjoins and/or at least partly includes an upper surface of said buried layer.

Preferred embodiments are listed in the respective dependent claims.

According to a preferred embodiment, said first semiconductor technology material is silicon carbide and said second semiconductor technology material is silicon.

According to another preferred embodiment, said step of burying is performed by a first ion implantation step at a first temperature followed by an optional annealing step.

According to another preferred embodiment, said step of creating a buried damage layer is performed by a second ion implantation step at a second temperature.

According to another preferred embodiment, said step of removing said upper part of said substrate and said buried damage layer is an etching step.

According to another preferred embodiment, said buried damage layer adjoins from below or includes said upper surface of said buried layer such that a part of said buried layer belongs to said damage layer. In this case, said part is selectively etched in said etching step against the other part of said buried layer.

According to another preferred embodiment, the width of said damage layer is varied along said upper surface of said buried layer. In this way, a structure may be patterned into said damage layer which is transferred to the buried layer.

According to another preferred embodiment, said damage layer traverses said buried layer in a laterally limited region.

According to another preferred embodiment, the width of said damage layer is varied by performing a locally limited third ion implantation step at a third temperature.

According to another preferred embodiment, the width of said damage layer is varied by performing said second ion implantation step in a locally modulated way.

According to another preferred embodiment, said substrate comprises a layer of a third semiconductor technology material.

According to another preferred embodiment, said layer of said third semiconductor technology material is a silicon oxide layer located under said buried layer.

According to another preferred embodiment, said layer of said third semiconductor technology material is a doped silicon layer located under said buried layer.

According to another preferred embodiment, a LED structure is formed on said layered structure.

Embodiments of the present invention are illustrated in the accompanying drawings and described in detail in the following.

Figure 1B:
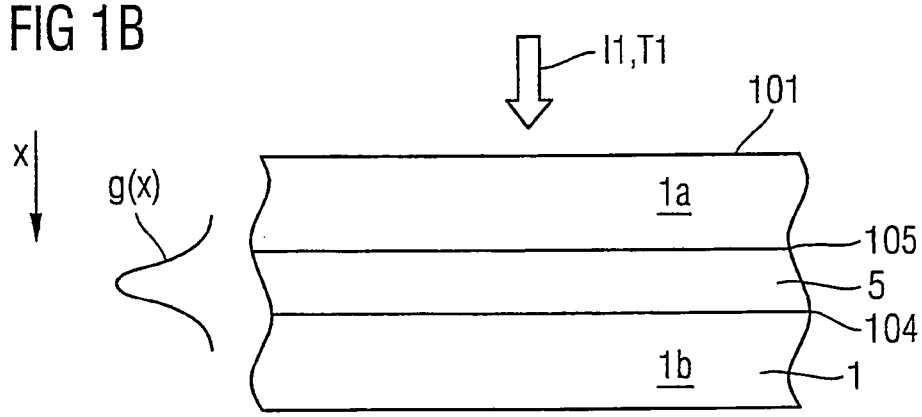
Figure 1C:
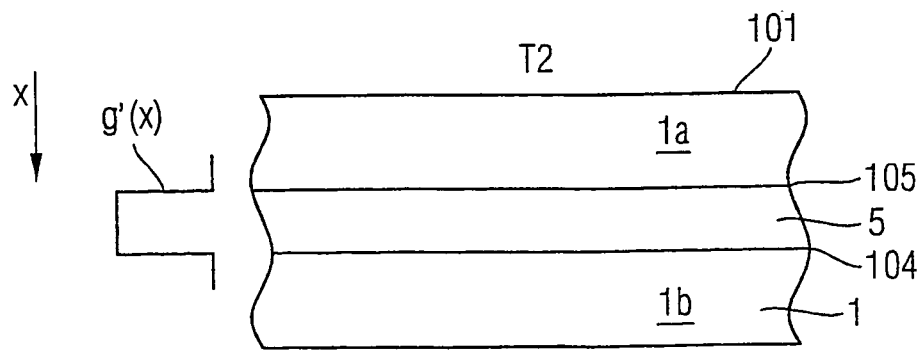
Figure 1D:
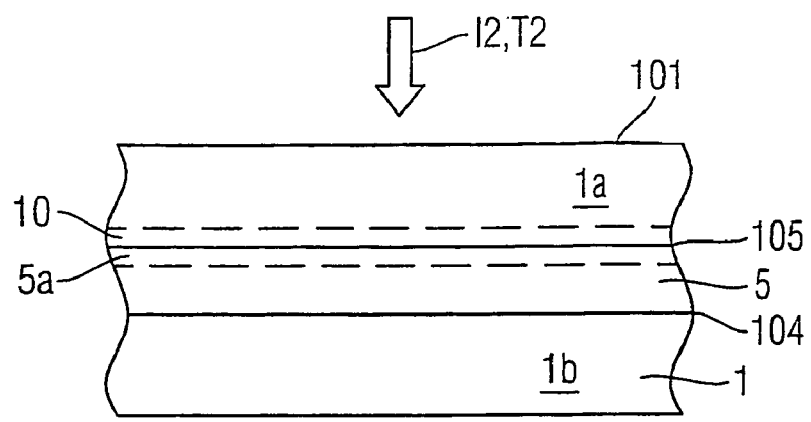
Figure 1E:
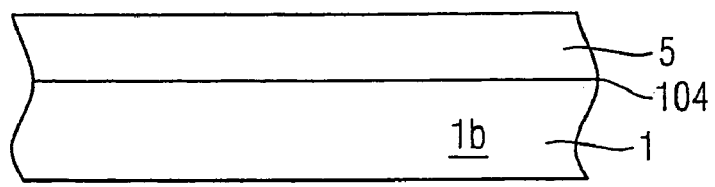
Figure 2:
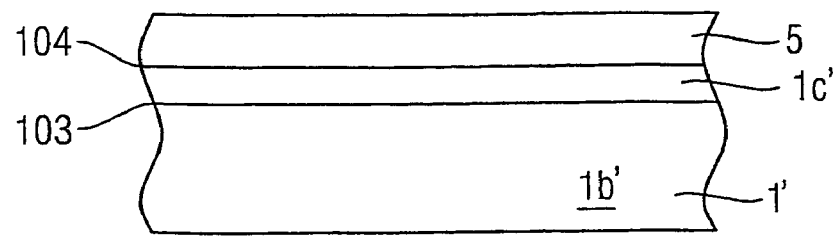
Figure 3:
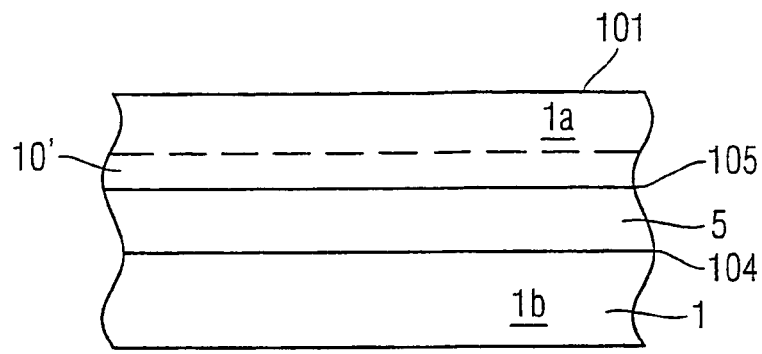
Figure 4A:
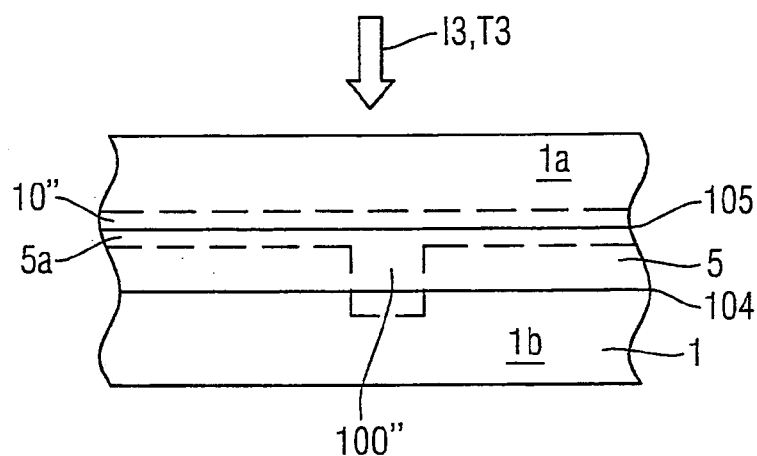
Figure 4B:
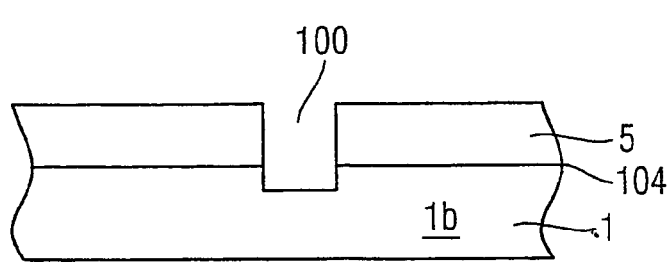
Figure 4C:
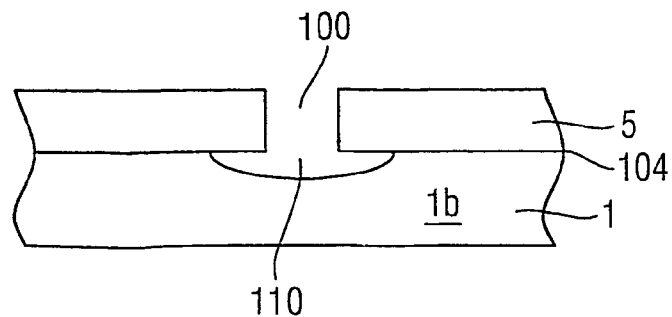
Figure 5:
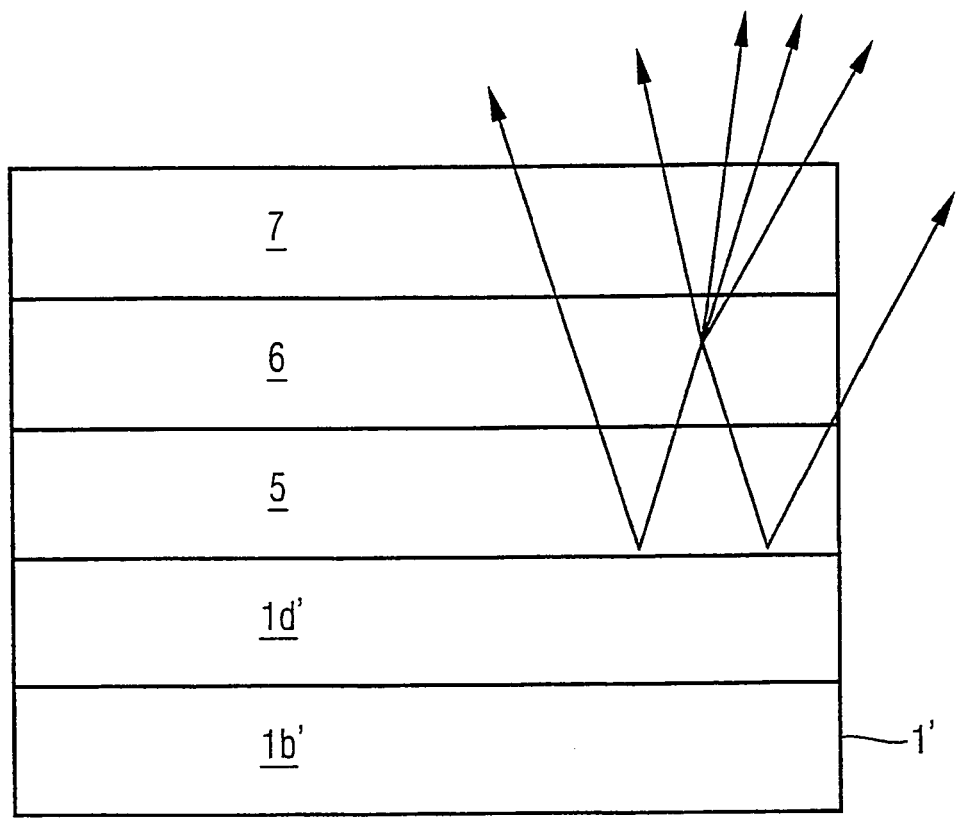

In the Figures:

FIGS. 1a-e show a process sequence of a first embodiment of the method according to the invention;

FIG. 2 shows a modification of the substrate of FIG. 1 in a second embodiment of the method according to the invention;

FIGS. 3a-c show a modification of the damage layer implantation step of FIG. 1 in a third embodiment of the method according to the invention FIGS. 4a-c show a process sequence of a fourth embodiment of the method according to the invention; and FIG. 5 show a process sequence of a fifth embodiment of the method according to the invention; and FIGS. 6a-c a prior art process sequence for manufacturing a silicon carbide device known from U.S. Pat. No. 6,214,107 B1.

Throughout the figures, the same reference signs denote identical or functionally identical parts.

FIGS. 1a-e show a process sequence of a first embodiment of the method according to the invention.

The starting point of the first embodiment of the method according to the present invention is a float zone silicon wafer 1, the main surface of which is denoted with reference sign 101 in FIG. 1a.

In this example, the wafer 1 had a <100> orientation and was of n-type conductivity (doped with phosphor) having a specific resistance of 1000 Ωcm. However, it should be noted that also other wafer substrates having different orientations and/or dopings and/or differently grown wafers (f.e. Czochralsky) are suitable.

As illustrated in FIG. 1b, carbon C is implanted in a first implantation step I1 at a temperature T1 such that a stoichiometric buried silicon carbide layer 5 is formed around the maximum of the C distribution. Said distribution is shown on the left-hand side of FIG. 1b and denoted $\rho(x)$ where x is the penetration depth. After the implantation step I1, the distribution can be fairly well described by a Gaussian distribution.

For example, the implantation parameters are the following:

Dose: $8.5 \times 10^{17}$ cm$^{-2}$

Energy: 180 keV

Current density: 10 μAcm$^{-2}$

Target temperature T1: 450° C.

The implantation step I1, however, results in a diffuse surface profile of the upper and lower surfaces 105, 104 of the implanted silicon carbide layer 5, namely because of said Gaussian distribution. In other words, there is no sharp transition from SiC to an upper and lower substrate part 1a, 1b formed due to the presence of the buried layer 5.

In order to have a box-shape distribution $\rho'(x)$ reflecting a desired sharp transition, as shown in FIG. 1c, a thermal annealing step at a temperature T2 of 1250° C. for approximately 10 hours is performed in an argon atmosphere. This annealing step provides a homogeneous single crystal 3C-SiC layer having plane upper and lower surface 105, 104. Here it should be noted that also other annealing conditions may be applicable, f.e. temperatures between 1200° C. and 1350° C.

The manufacture of such a buried silicon carbide layer 5 by ion beam synthesis using such conditions was disclosed first by J. K. N. Lindner, A. Frohnwieser, B. Rauschenbach and B. Stritzker, Fall Meeting of the Materials Research Society, Boston, USA (1994), Mater. Res. Soc. Syn. Proc. Vol. 354 (1995), 171.

However, so far it was not possible to obtain a smooth epitaxial silicon carbide surface layer 5 by simply removing the upper part 1a of the substrate, either by chemical etching or by a chemical mechanical polishing process. Namely, due to the presence of silicon carbide precipitations and/or surface clusters, the upper surface 105 of the silicon carbide layer 5 always exhibited an undesired roughness. Experiments showed that in an attempt to remove the upper substrate layer f.e. by etching, SiC particles in random order are redeposited on the substrate surface causing a very rough substrate surface. Presumably, due to the polar portion of the silicon carbide bounds, these particles very firmly adhere to the silicon carbide surface.

According to this embodiment of the present invention, as further explained with reference to FIG. 1d, this serious prior art problem could be solved for the first time.

Theretofore, an implantation step I2 at a temperature T2 is performed wherein a damage layer 10, in this example an amorphous layer, having a sharp interface to the single crystal silicon carbide of the buried silicon carbide layer 5 is created.

For said implantation step I2, the noble gas helium is used, namely because of its chemical inert behavior. However, in principle, also other ions may be used, e.g. hydrogen, oxygen, boron, phosphorous, neon etc.

For example, here the following implantation parameters for helium ions were adopted:

Dose: $1.0 \times 10^{17}$ cm$^{-2}$

Energy: 50-55 keV

Current density: 10 μAcm$^{-2}$

Target temperature: 100° C.

As clearly illustrated in FIG. 1d, here the amorphous damage layer 10 includes or embraces the upper surface 105 of the buried silicon carbide layer 5. In other words, the amorphous damage layer 10 extends to a part of the upper part 1*a* of the substrate and to a part 5*a* of the buried silicon carbide layer 5.

By appropriate selection of the energy, ion-type, dose and target temperature, it is possible to obtain a sharp interface between the crystalline phase of the buried silicon carbide layer 5 and the damaged part 5*a*. Moreover, the penetration depth and width of the amorphous damage layer 10 can be varied as desired.

Normally, a trade-off has to be found for the implantation temperature T2 and the ion-type. F.e., if the implanted ions are comparably light ions, the temperature T2 should not be too high in order to avoid an in situ annealing. Heavy ion species exhibits the advantage that the necessary dose (implantation time) may be drastically reduced. The ion energy has to be enhanced for heavier ions because of their smaller penetration depth. If the implantation temperature T2 is too low, however, the smoothness of the surfaces of the exposed silicon carbide layer may be decreased.

In a next step, as illustrated in FIG. 1*e*, the upper part of the substrate 1*a* and the buried damage layer 10 are removed in an etch step using an etching solution containing HF/HNO$_3$ which is a standard etching solution in silicon process technology. Here, a mixing ratio of 1:6 has proved to be very efficient. However, also other etching chemistry including other concentration ratios and/or other etchants may be applied, such as KOH, TMAH, etc.

The etching time amounts to a few seconds, and the chemical reaction is selectively stopped on the crystalline part of the buried silicon carbide layer 5. The time of the etching step is therefore not critical and a robust process may be obtained.

As a result, a high quality Si/SiC substrate having the silicon substrate part 1*b* and the remaining silicon carbide layer 5 is obtained, as illustrated in FIG. 1*e*.

The main advantage of the obtained silicon carbide layer 5 after this etching step is the smoothness of its surface. The reason is that SiC precipitations in the upper substrate part 1*a* near the surface 105 are completely etched away. Thus, SiC particles which are contained in the upper part of the substrate 1*a* which lies above the buried silicon carbide layer are not redeposited on the surface to the exposed, but are contained in a damage layer and removed in the final etching step. Moreover, it is of advantage to remove a certain fraction of the buried silicon carbide layer by having an appropriate penetration depth of the damage layer 10 into said silicon carbide layer 5 in order to provide an intermediate part of the buried SiC layer as new surface, because this part is structurally better developed than the upper part and therefore provides best conditions for a smooth surface.

In a final treatment step which is not illustrated, a cleaning treatment in deionized water for removing residuals of the etching solution may be performed.

FIG. 2 shows a modification of the substrate of FIG. 1 in a second embodiment of the method according to the invention.

As depicted in FIG. 2, the substrate 1' comprises lower parts 1*b'* and 1*c'*, where 1*b'* denotes a silicon part and 1*c'* denotes a silicon dioxide part. Such a substrate is known as SOI (silicon on insulator) substrate.

FIGS. 3*a-c* show a modification of the damage layer implantation step of FIG. 1 in a third embodiment of the method according to the invention.

According to the third embodiment shown in FIG. 3; a damage layer 10' is created which does not penetrate into the buried silicon carbide layer 5, but merely adjoins or stops at its upper surface 105.

Moreover, according to a further non-illustrated embodiment, the damage layer could also adjoin the upper surface 105 from below or, in other words, be only contained in the buried silicon carbide layer 5.

FIGS. 4*a-c* show a process sequence of a fourth embodiment of the method according to the invention.

Regarding the fourth embodiment, the starting point is the structure shown in FIG. 1*c*. However, here an implantation step I3 at the temperature T3 is applied which does not produce a damage layer having a plane upper and lower surface, but a damage layer 10 which is modulated in penetration depth. Particularly, the damage layer 10" includes an intermediate portion 100" which fully penetrates the buried silicon carbide layer 5 and also enters the lower part of the substrate 1*b*. This can be achieved by an ion beam implantation step 13 wherein the penetration depth is modulated by locally changing the energy of the ion beam without using any mask. The result of this implantation step 13 is shown in FIG. 4*a*.

Another possibility for obtaining a modulated penetration depth would be the use of two implantation steps where the first step corresponds to I2 and the second step one has higher energy and is limited to the intermediate portion 100" by means of a mask.

In the next step, the etching is performed with HF/HNO$_3$ as in the first to third embodiments resulting in the structure shown in FIG. 4*b*. Here, the exposed silicon carbide layer 5 is separated into two parts having a deep trench 100 separating said parts. The structure shown in FIG. 4*b* is very well suited for micromechanical designs the manufacture of which includes an under-etching step for producing sensor parts suspended over the substrate.

Such an under-etching step is illustrated with respect to FIG. 4*c* creating an under-etching region 110.

Here it should be noted that any structure can be patterned into said damage layer and then be transferred by etching to the SIC layer.

FIG. 5 show a process sequence of a fifth embodiment of the method according to the invention.

According to the fifth embodiment shown in FIG. 5, the epitaxial silicon carbide layer 5 on a substrate part 1*b'*, 1*d'* of substrate 1' is used for further process steps resulting in an LED structure (LED=Light Emitting Diode).

Here, the substrate part 1*b'* denotes a silicon wafer part, and the substrate part 1*d'* denotes a doped silicon part, which part is, for example, obtained by an additional implantation step.

On top of the silicon carbide surface of the silicon carbide layer 5, an indium-aluminum-gallium-nitrogen layer is deposited on top of which a metallization layer 7 is provided for providing said light emitting diode structure. Thus, the inventive method provides a suitable substrate for making LEDs in a non-expensive process sequence.

Instead of the substrate having substrate part 1*b'* as a silicon wafer part and substrate part 1*d'* as a doped silicon part, also a suitably highly doped substrate may be used.

Although the present invention has been described with regard to specific embodiments, it is not limited thereto, but may be modified in many ways.

Particularly, the described materials are only examples and replaceable by other suitable materials. The same is true for the etch processes. Also, the invention may be used for other semiconductor technology substrate layers.

Although, in the above embodiments, the implantation step has resulted in an amorphous buried damage layer, the present invention is not restricted thereto. Of course, dependent on the implantation ion species and the other implantation parameters, also a certain degree of damage may be sufficient to obtain a damage layer which can be easily removed in the etching step leaving back a smooth surface of the exposed silicon carbide layer.

Here it should be mentioned that the first annealing step for converting the Gaussian profile into the box shape profile may be omitted, if the implantation step for providing the buried damage layer enables to cut off a sufficiently large portion of the tail of the Gaussian distribution. This would further simplify the method for obtaining the smooth silicon carbide surface.

Also the LED structure is merely an example of a broad variety of possible structures that can be formed on the layered semiconductor technology structure according to the invention.

REFERENCE SIGNS 1,11 substrate
101 substrate surface
1a,1b,1b'
11a,11b substrate parts
5 buried SiC layer
104,105 surfaces of buried SiC layer
I,I1-3 implantation step
T1-3 implantation temperature
ρ,ρ' C density distribution
10,10',
10",100" buried damage layer
5a part of 5 which belongs to 10
103 lower surface of 1c'
1c' silicon dioxide layer
110 underetch region
100 trench
1d' doped substrate region
6 In—Ga—Al—N layer
7 metallisation

The invention claimed is:

1. A method for forming a layered semiconductor technology structure having a layer (5) of a first semiconductor technology material on a substrate (1; 1') of at least one second semiconductor technology material, comprising the steps of:
 providing said substrate (1; 1');
 burying said layer (5) of a first semiconductor technology material in said substrate (1; 1'), said buried layer (5) having an upper surface (105) and a lower surface (104) and dividing said substrate (1; 1') into an upper part (1a) and a lower part (1b; 1b'; 1c);
 creating a buried damage layer (10; 10'; 10"; 100") which at least partly adjoins and/or at least partly includes said upper surface (105) of said buried layer (5); and
 removing said upper part (1a) of said substrate (1; 1') and said buried damage layer (10; 10'; 10"; 100") for exposing said buried layer (5).

2. The method according to claim 1, wherein said first semiconductor technology material is silicon carbide and said second semiconductor technology material is silicon.

3. The method according to claim 1, wherein said step of burying is performed by a first ion implantation step (I1) at a first temperature (T1) followed by optional annealing step (T2).

4. The method according to claim 1, wherein said step of creating a buried damage layer (10; 10'; 10"; 100") is performed by a second ion implantation step (I2) at a second temperature (T2).

5. The method according to claim 1, wherein said step of removing said upper part (1a) of said substrate (1; 1') and said buried damage layer (10, 10'; 10"; 100") is an etching step.

6. The method according to claim 5, wherein said buried damage layer (10; 10'; 10"; 100") adjoins from below or includes said upper surface (105) of said buried layer (5) such that a part (5a) of said buried layer (5) belongs to said damage layer (10; 10'; 10"; 100") and wherein said part (5a) is selectively etched in said etching step against the other part of said buried layer (5).

7. The method according to claim 1, wherein the width of said damage layer (10; 10'; 10"; 100";) is varied along said upper surface (105) of said buried layer (5).

8. The method according to claim 7, wherein said damage layer (10; 10'; 10"; 100";) traverses said buried layer (5) in a laterally limited region (100").

9. The method according to claim 7, wherein the width said damage layer (10; 10'; 10"; 100";) is varied by performing a locally limited third ion implantation step (I3) at a third temperature (T3).

10. The method according to claim 7, wherein the width of said damage layer (10; 10'; 10"; 100";) is varied by performing said second ion implantation step (I2) in a locally modulated way.

11. The method according to claim 1, wherein said substrate (1; 1') comprises a layer (1c', 1d') of a third semiconductor technology material.

12. The method according to claim 11, wherein said layer (1c', 1d') of said third semiconductor technology material is a silicon oxide layer (1c') located under said buried layer (5).

13. The method according to claim 11, wherein said layer (1c', 1d') of said third semiconductor technology material is a doped silicon layer (1d') located under said buried layer (5).

14. The method according to claim 13, further comprising the steps of:
 forming a LED structure on said layered structure.

* * * * *